(12) United States Patent
Patalay et al.

(10) Patent No.: US 8,726,837 B2
(45) Date of Patent: May 20, 2014

(54) SEMICONDUCTOR PROCESS CHAMBER VISION AND MONITORING SYSTEM

(75) Inventors: Kailash K. Patalay, Santa Clara, CA (US); Craig Metzner, Fremont, CA (US); David K. Carlson, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 1299 days.

(21) Appl. No.: 12/144,485

(22) Filed: Jun. 23, 2008

(65) Prior Publication Data

US 2009/0314205 A1 Dec. 24, 2009

(51) Int. Cl.
*B05C 11/00* (2006.01)
*C23C 16/00* (2006.01)
*G01N 21/00* (2006.01)
*G01J 5/00* (2006.01)

(52) U.S. Cl.
USPC ........... 118/713; 118/715; 118/725; 118/666; 118/668; 356/237.1; 374/130

(58) Field of Classification Search
USPC ............ 118/713, 715, 725, 666, 668; 348/87; 356/237.1; 374/130
See application file for complete search history.

(56) References Cited

U.S. PATENT DOCUMENTS

| | | | | |
|---|---|---|---|---|
| 5,742,395 A * | 4/1998 | Biedermann et al. ... | 257/E21.53 |
| 5,807,511 A * | 9/1998 | Kunimatsu et al. ........... | 252/587 |
| 5,900,971 A * | 5/1999 | Ning .............................. | 359/435 |
| 6,183,130 B1 * | 2/2001 | Adams et al. ................. | 219/405 |
| 6,197,117 B1 * | 3/2001 | Li et al. ......................... | 118/715 |
| 7,173,648 B1 * | 2/2007 | Phan et al. .................. | 356/237.1 |
| 2003/0151733 A1 | 8/2003 | Vatus et al. | |
| 2003/0202092 A1 | 10/2003 | Sadighi et al. | |
| 2006/0033513 A1 * | 2/2006 | LaMeres et al. .............. | 324/754 |
| 2007/0077355 A1 * | 4/2007 | Chacin et al. ............. | 427/248.1 |
| 2008/0146925 A1 * | 6/2008 | Byrd et al. .................... | 600/438 |
| 2008/0312536 A1 * | 12/2008 | Dala-Krishna ............... | 600/459 |

\* cited by examiner

*Primary Examiner* — Dah-Wei D Yuan
*Assistant Examiner* — Binu Thomas
(74) *Attorney, Agent, or Firm* — Servilla Whitney LLC

(57) ABSTRACT

A system for monitoring a process inside a high temperature semiconductor process chamber by capturing images is disclosed. Images are captured through a borescope by a camera. The borescope is protected from high temperatures by a reflective sheath and an Infrared (IR) cut-off filter. Images can be viewed on a monitor and can be recorded by a video recording device. Images can also be processed by a machine vision system. The system can monitor the susceptor and a substrate on the susceptor and surrounding structures. Deviations from preferred geometries of the substrate and deviations from preferred positions of susceptor and the substrate can be detected. Actions based on the detections of deviations can be taken to improve the performance of the process. Illumination of a substrate by a laser for detecting deviations in substrate geometry and position is also disclosed.

20 Claims, 5 Drawing Sheets

SEMICONDUCTOR PROCESS CHAMBER VISION AND MONITORING SYSTEM

TECHNICAL FIELD

One or more embodiments of the present invention relate to monitoring a process inside a high temperature semiconductor process chamber. More specifically, embodiments of the invention pertain to a system that utilizes a vision system to monitor the position of the wafer and/or components of the chamber.

BACKGROUND

Semiconductor process chambers experience high operational temperatures, for example, in the range of 650-1150° C., in the uniform epitaxial deposition of a material on a substrate such as a wafer. Radiative lamp heating in such chambers and laminar cross-flow design for uniform deposition requires accurate positioning and centering of a wafer in the chamber. A wafer rotation and lift mechanism in the chamber requires extensive set-up for accurate positioning of the wafer during process. During wafer processing, a wafer is positioned on a susceptor. If the susceptor position is incorrect, for example, if it is not level, off-center or exhibits wobble, the positional inaccuracy can cause non-concentric or even an "out-of-pocket" wafer placement. Also, high wafer transfer temperature, desired for high throughput, may cause thermal shock and deformation to the wafer. This can lead to wafer positional inaccuracies on a robot-blade or susceptor, resulting in non-uniform film thickness, slip-line defects or even wafer breakage in the chamber which can prove very costly to the customer. Current practice to solve these problems relies on efforts to adjust positions and limit transfer temperatures without the ability to see the wafer during process.

Improved and automatic monitoring of substrate positioning, and adjustment to warping or deformation of a substrate from camera images can greatly improve the efficiency of the fabrication process of the processing chamber. Accordingly improved methods and apparatus for substrate monitoring by providing a monitoring system that monitors the position of the wafer from the inside of a high temperature process chamber are desired.

SUMMARY OF THE INVENTION

Embodiments of the invention relate to methods and apparatus for optical monitoring of processing of a wafer in a reaction chamber with high temperatures.

In accordance with an embodiment of the present invention, an optical monitoring system for a semiconductor substrate process chamber is provided that comprises: a borescope having a sensor end and a viewing end, the viewing end being positioned inside the process chamber and adapted to withstand temperatures exceeding 500° C.; an optical sensor positioned at the sensor end of the borescope, the sensor enabled to provide a signal representing an image; and an infrared (IR) filter positioned at the viewing end of the borescope and a reflective sheath covering the borescope, the system being adapted to monitor positions of the substrate in the process chamber.

In accordance with another embodiment of the present invention, an optical monitoring system for a semiconductor substrate process chamber is provided wherein the monitoring system is adapted to monitor a susceptor supporting the substrate in the process chamber.

In accordance with a further embodiment of the present invention, an optical monitoring system for a semiconductor substrate process chamber is provided, wherein the system is adapted to measure a position in situ during wafer processing.

In accordance with another embodiment of the present invention, an optical monitoring system for a semiconductor substrate process chamber is provided, wherein the borescope is positioned to enable the sensor to obtain an image of an edge of the substrate and an edge of the susceptor.

In accordance with a further embodiment of the present invention, an optical monitoring system for a semiconductor substrate process chamber is provided, wherein an operational temperature inside the chamber is in a range of about room temperature (i.e., about 25° C.) to about 1200° C.

In accordance with a further embodiment of the present invention, an optical monitoring system for a semiconductor substrate process chamber is provided, wherein the sensor is a charge coupled device (CCD) or CMOS camera.

In accordance with another embodiment of the present invention, an optical monitoring system for a semiconductor substrate process chamber is provided, further comprising a vision system enabled to process signals provided by the camera.

In accordance with a further embodiment of the present invention, an optical monitoring system for a semiconductor substrate process chamber is provided, wherein the system is configured to determine deviation of a position of a substrate compared to a preferred position of the substrate.

In accordance with another embodiment of the present invention, an optical monitoring system for a semiconductor substrate process chamber is provided, wherein the system is configured to detect at least one occurrence out selected from wafer slide, out-of-pocket, susceptor centering, susceptor wobble, preheat ring alignment, wafer droop, warpage, robot blade misalignment and warping of a substrate.

In accordance with a further embodiment of the present invention, an optical monitoring system for a semiconductor substrate process chamber is provided, wherein the system is enabled to output data to a process monitoring system.

In accordance with another embodiment of the present invention, an optical monitoring system for a semiconductor substrate process chamber is provided, wherein the borescope has a field of view in the range of 20 to 60 degrees, an aperture in the range of 2 mm to 10 mm, and the borescope provides a complete image fill of the sensor.

In accordance with a further embodiment of the present invention, an optical monitoring system for a semiconductor substrate process chamber is provided, wherein the system is enabled to output data to a semiconductor fabrication laboratory monitoring system.

In accordance with another embodiment of the present invention, an optical monitoring system for a semiconductor substrate process chamber is provided, further comprising an image recording device enabled to record a signal provided by the sensor.

In accordance with a further embodiment of the present invention, an optical monitoring system for a semiconductor substrate process chamber is provided, further comprising a laser configured to illuminate the substrate with a laser spot and a detector enabled to detect the laser spot.

In accordance with a further embodiment of the present invention, an optical monitoring system for a semiconductor substrate process chamber is provided, wherein the detector is a detector array and the sensor is a camera.

In accordance with a further embodiment of the present invention, an optical monitoring system for a semiconductor substrate process chamber is provided, wherein a pair of lasers and a pair of detectors are provided.

In accordance with another embodiment of the present invention, an optical monitoring system for a semiconductor substrate process chamber is provided, further comprising a processor and software executable by the processor that is capable of determining plane coordinates of the laser spot.

In accordance with a further embodiment of the present invention, an optical monitoring system for a semiconductor substrate process chamber is provided, further comprising software to detect variations in geometric properties of the substrate from variations in plane coordinates of the laser spot.

In accordance with another embodiment of the present invention, a kit incorporating the optical monitoring system is provided, and further comprising fixtures and cabling.

In accordance with a further embodiment of the present invention, a semiconductor processing chamber incorporating the optical monitoring system is provided.

In accordance with another embodiment of the present invention, a kit for an optical monitoring system for a semiconductor processing chamber including one or more of the group of borescope, reflective sheath, IR filter and mounting brackets is provided.

The foregoing has outlined rather broadly certain features and technical advantages of the present invention. It should be appreciated by those skilled in the art that the specific embodiments disclosed may be readily utilized as a basis for modifying or designing other structures or processes within the scope present invention. It should also be realized by those skilled in the art that such equivalent constructions do not depart form the spirit and scope of the invention as set forth in the appended claims.

DETAILED DESCRIPTION

Before describing several exemplary embodiments of the invention, it is to be understood that the invention is not limited to the details of construction or process steps set forth in the following description. The invention is capable of other embodiments and of being practiced or being carried out in various ways.

Semiconductor processing such as epitaxial deposition on a substrate, for example, a wafer utilizes a processing chamber under high temperatures. As used herein, high temperature refers to temperatures exceeding about 500° C., as many semiconductor processes exceed this temperature. For example, many processing temperatures in semiconductor processing chambers are between about 650 and 850° C., and some etching temperatures exceed 1100° C. According to embodiments of the invention, the components of the vision system described herein and located in the process chamber are adapted to withstand such temperatures and still provide wafer and/or susceptor position monitoring. A diagram of an epitaxial process chamber is provided in FIG. 1.

Figure 1:
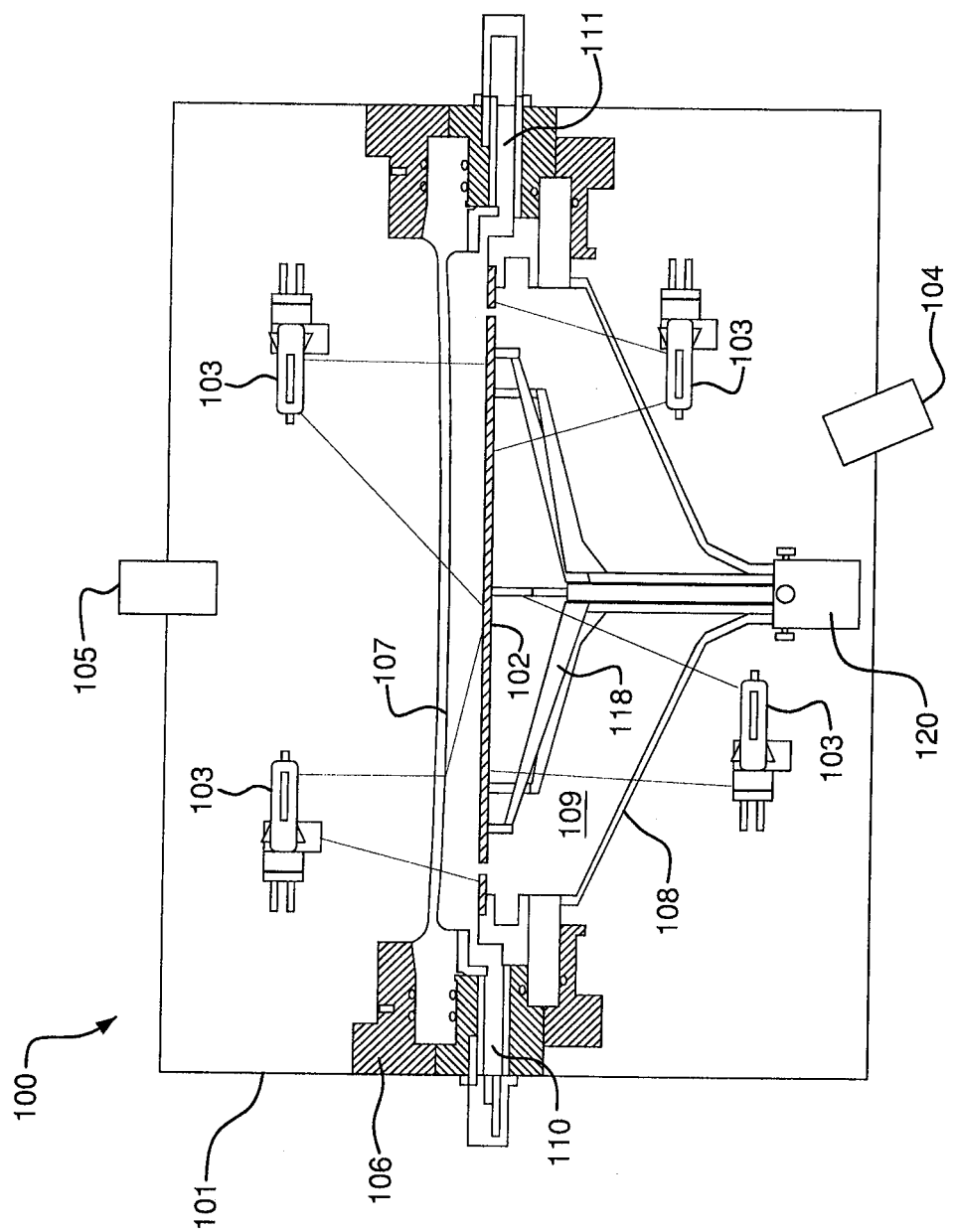
FIG. 1 is a diagram of a high temperature semiconductor process chamber according to one embodiment.

FIG. 1 illustrates a semiconductor processing system 100 which is used for carrying out a method according to the invention. The system 100 includes a semiconductor processing chamber 101, a susceptor 102 within the chamber 101, and infrared lamp heaters 103. Each identified lamp 103 may be a plurality of lamps. A lower pyrometer 104 and an upper pyrometer 105 may be included. The chamber 101 includes a base ring 106, an upper quartz window 107, and a lower quartz window 108. The quartz windows 107 and 108 have peripheries that seal with the base ring 106. The base ring 106, together with the quartz windows 107 and 108, define an internal volume 109. A gas inlet 110 is formed through the base ring 106 into the internal volume 109, and a gas outlet 111 is formed out of the internal volume 109 on a side of the internal volume 109 opposing the gas inlet 110. A slit valve opening (not shown) is formed through the base ring 106. A wafer substrate can be inserted into and later be removed from the internal volume 109 through the slit valve opening. The susceptor 102 is mounted in a substantially horizontal orientation within the internal volume 109 by means of a susceptor support structure 118. The wafer substrate can be located on top of the susceptor 102.

Heat is provided by infrared lamps 103. The infrared lamps 103 radiate infrared radiation through the quartz windows 107 and 108 on a lower surface of the susceptor 102 and from above on the wafer substrate.

In use, a wafer substrate is inserted into the internal volume 109 and located on top of the susceptor 102. The slit valve closes the slit valve opening through which the wafer is inserted into the internal volume 109. A pump (not shown) connected to the gas outlet 111 is operated so that the internal volume 109 is maintained at a required, constant pressure. The susceptor 102 heats the wafer substrate to a processing wafer temperature. Processing gases are then introduced through the gas inlet 110. The processing gases flow at a constant rate over an upper surface of the wafer substrate and then out of the gas outlet 111. The gases combine with one another and deposit a layer on top of the wafer substrate according to conventional principles relating to chemical vapor deposition.

The robot provides both lateral and rotational movement of a substrate on a robot blade to retrieve, transfer, and deliver substrates from one location within the system to another. The robot blade inserts the substrate through the slit valve in the processing chamber.

Once the wafer is located in the chamber, a wafer rotation and lift mechanism 120 of the chamber 101 requires extensive set-up for accurate positioning of the wafer during process. A wafer is positioned on the susceptor 102. If the susceptor is not in the optimal position, for example if it is out of level, off-center or wobbles, such positional inaccuracies can cause non-concentric or even an "out-of-pocket" wafer placement. Also, high wafer transfer temperature, desired for high throughput, may cause thermal shock and deformation to the wafer. One example of such deformation is referred to a potato-chip defect, in which portions of the wafer are distorted and warped. This can lead to wafer positional inaccuracies on a robot-blade or susceptor, resulting in non-uniform film thickness, slip-line defects or even wafer breakage in the chamber which can prove very costly to the customer.

Embodiments of the present invention provide as system to improve monitoring of substrate positioning. Certain embodiments allow the operator of the process chamber to adjust settings and conditions with the processing chamber when a positional inaccuracy is detected. Embodiments of the present invention address these problems by providing a real-time view of the wafer in the chamber in-situ to troubleshoot the above issues. In one or more embodiments, a live video of the wafer and the susceptor can be used as feedback to adjust and optimize robot-blade and susceptor hand-off positions, and wafer transfer temperature to allow accurate positioning of the wafer.

One embodiment includes a high temperature borescope along with a camera, monitor. Certain embodiments utilize a video recording system to see and record live video inside the process chamber. As noted earlier, the temperature inside the processing chamber may reach very high temperatures, for example exceeding 650° C. during deposition, and exceeding 1100° C. during etching operations.

According to one or more embodiments, a borescope is used to provide an optical path from the inside of the processing chamber to the outside of the chamber. The borescope may be positioned at an existing viewing port in the inner heat shield of the chamber. Alternatively, a new viewing port may also be created for the borescope. The borescope has an input end from which light enters the borescope and a viewing or sensor end for viewing an image. As used herein, "end" does not necessarily mean the tip of borescope, and may include opposition halves of the device. The input end of the borescope will be positioned above the top quartz window inside the chamber, so the susceptor and the wafer positioned on the susceptor can be viewed. An optical sensor, for example, a camera, will be attached to the sensor end which will be outside the inner heat shield, and in some embodiments, outside the chamber. In certain embodiments, to protect the borescope from melting and overheating, a reflective sheath is positioned around the borescope.

In one or more embodiments, the reflective sheath can be polished, silver coated or gold coated. In one or more embodiments, the inside of the reflective sheath is kept cool below 100° C. when the chamber temperature is in the range of about is 500° C. to about 1200° C. Furthermore, according to certain embodiments, an Infrared (IR) cut-off filter is positioned on the input side of the borescope to protect the inside of the borescope and the camera. Different IR band-pass filters may be applied. However the band-pass wavelength of the IR filter is preferably selected such that the transmission through the visible wavelengths is between 20% to 50% but the transmission at near and far infrared wavelengths is less than 10%.

Figure 2:
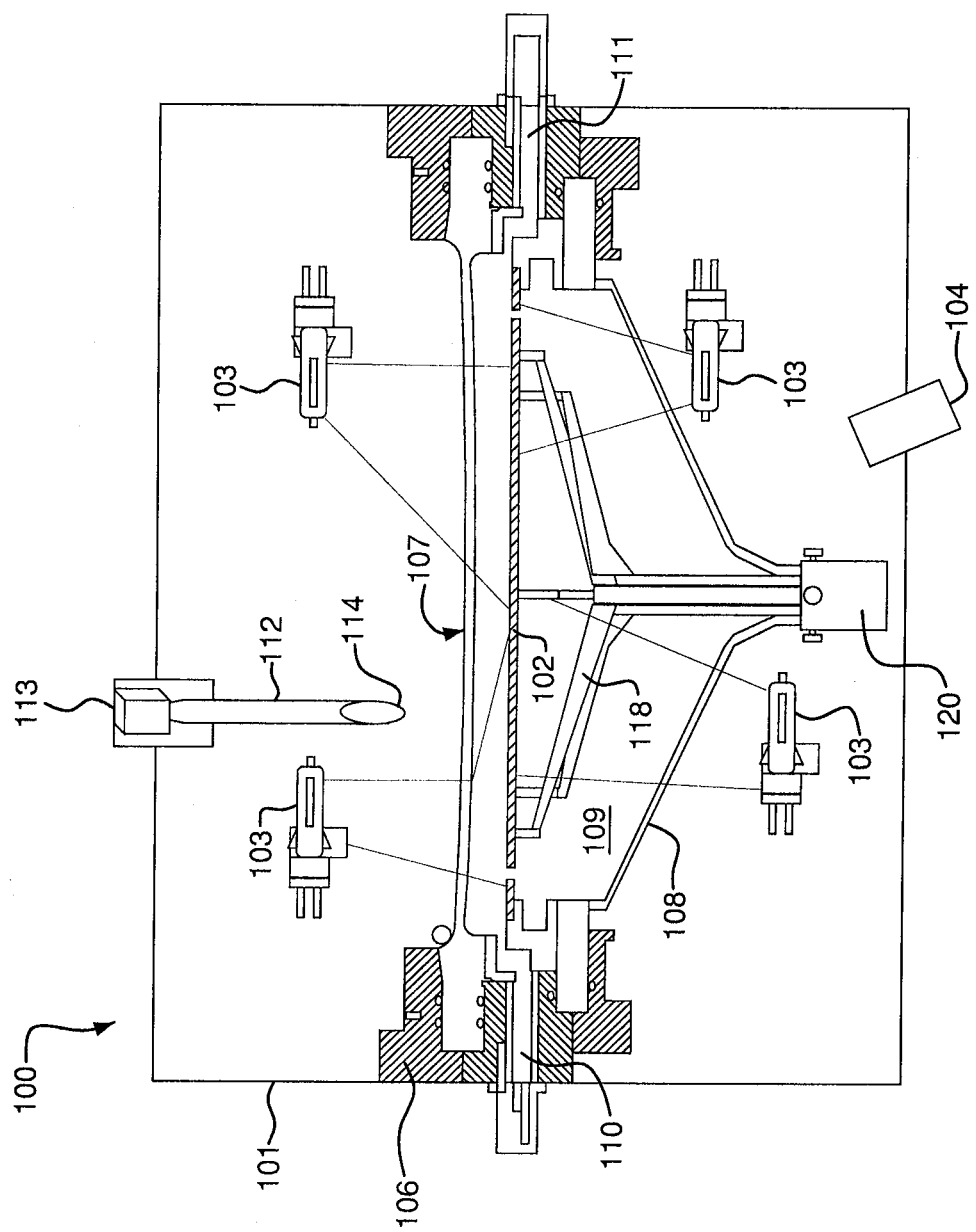
FIG. 2 is a diagram of a high temperature semiconductor process chamber in accordance with an embodiment of the present invention.

FIG. 2 diagrammatically shows a processing chamber 101 including a borescope 112 having an input end or viewing end 114 positioned above upper quartz dome 107 as its 'hot' end and an optical sensor 113 is positioned on the 'cool' viewing end 114. The optical sensor can be any conventional camera. However, as it is intended to capture video images from the substrate and the susceptor, it is desirable that the camera is a video camera with recordable output. Furthermore, it may be desirable to process geometrical information of the position of a wafer as part of a vision system. Accordingly, in such a case, a camera will be used that can provide image data that can be viewed on a monitor, recorded by a recorder such as a digital video recorder (DVR) and that can be processed by a vision system.

Figure 3:
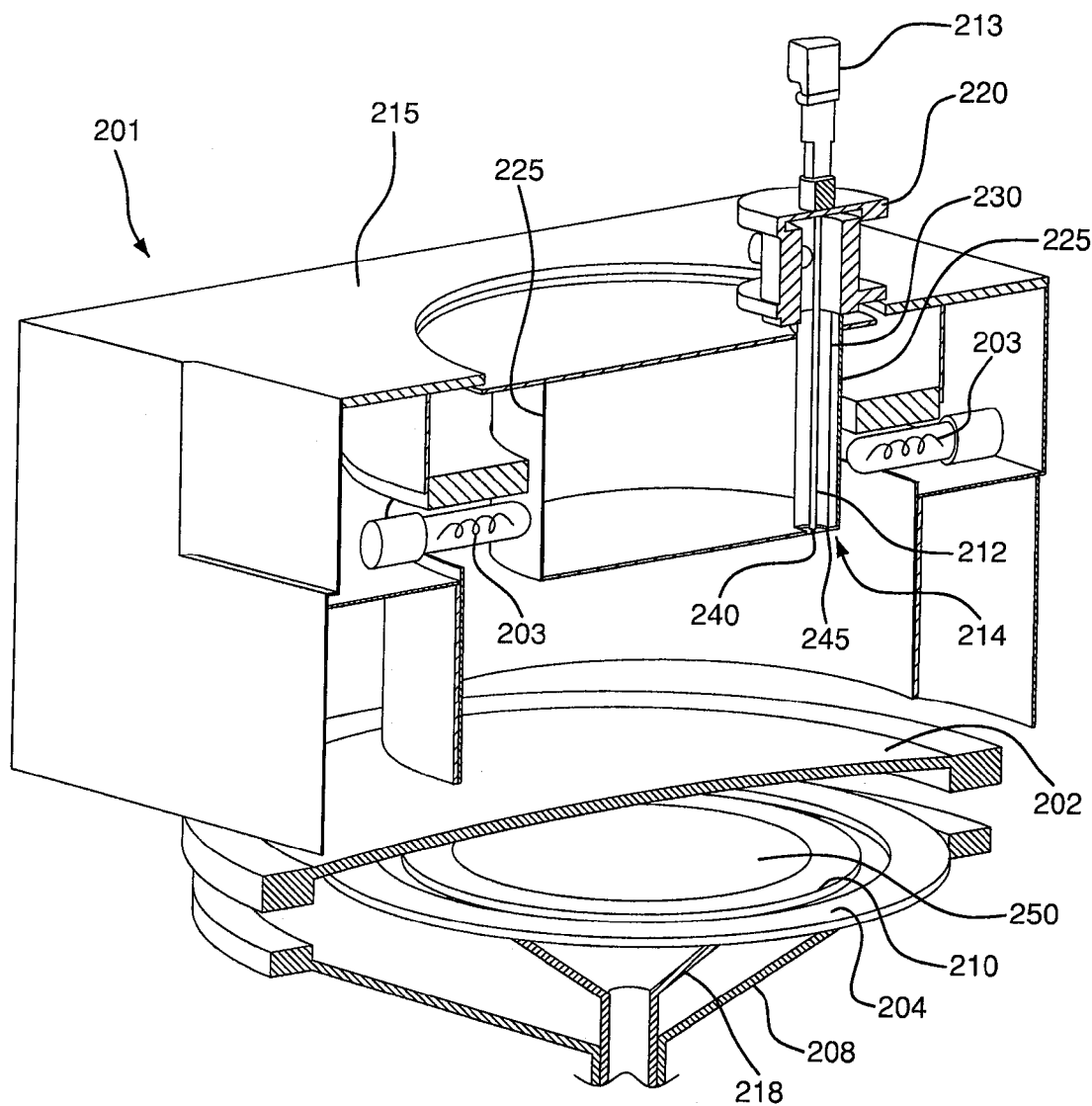
FIG. 3 is a diagram of positioning a borescope in accordance with an embodiment of the present invention.

According to embodiments of the invention, provisions should be made so that the borescope and the camera will not be damaged or adversely affected by high temperatures or excessive radiation. In one or more embodiments, an upper limit of 90° C. is adequate to prevent any damage. FIG. 3 shows in diagram an embodiment of a borescope 212 in a processing chamber. The processing chamber 201 has an upper dome 202 and a lower dome 208 and infrared lamps 203. In the chamber, a preheat ring 204 circumferentially surrounds a susceptor 210, which supports a substrate 250 such as a semiconductor wafer is viewed through the borescope 212. The susceptor is supported by the susceptor support structure 218. The borescope 212 is placed through the outer shell 215 of the process chamber 201 and positioned by a bracket 220 in a fixed position with a camera end 213 on the outside of the chamber. The viewing end 214 of the borescope is positioned within an inner heat shield 225 with a viewing port. The borescope is covered by a reflective sheath 230. The reflective sheath 230 can for instance be a reflective sheath made by a polishing or gold-plating process. The viewing end 214 is positioned at a viewing port 245 in the inner heat shield 225. The viewing end 214 of the borescope is further covered by an infrared (IR) cut-off filter 240 that reflects most of the IR radiation but passes visible light for viewing by the camera.

Application of the reflective sheath and IR filter keep the borescope and optics temperature below 100° C. or well within safe limits. Temperatures were measured using a stainless tube with thermocouples. Measured temperatures of the borescope with the sheath and the filter remained below 75° C., which are well within safe operation margins for the borescope.

According to an embodiment of the invention, the borescope can be integrated in a newly constructed semiconductor processing chamber. In another embodiment of the present invention, the borescope can also be provided as a kit, including the required fixtures and components to be put into existing semiconductor processing chambers. The kit may include one or more of the group of borescope, reflective sheath, IR filter, mounting brackets, camera, image capture card, a/d converter, cables, digital video recorder and other accessories.

Test of Viewing System

A borescope with sheath and filter with a camera were installed in an Applied Material Epi Centura® semiconductor processing unit. The system was used to detect wafer positional inaccuracies on the robot blade and on the susceptor to limit amongst others non-uniform thickness, slip-line defects and wafer breakage. A real-time view of a substrate such as a wafer in-situ can help prevent and troubleshoot the above problems and potentially other problems. A live video of the wafer and the susceptor was used as feedback to adjust and optimize robot-blade and susceptor hand-off positions to allow accurate positioning of the wafer. Such as system can be used to adjust the wafer transfer temperature to optimize throughput. This may significantly reduce set-up time, errors and prevent process deviations.

Figure 4:
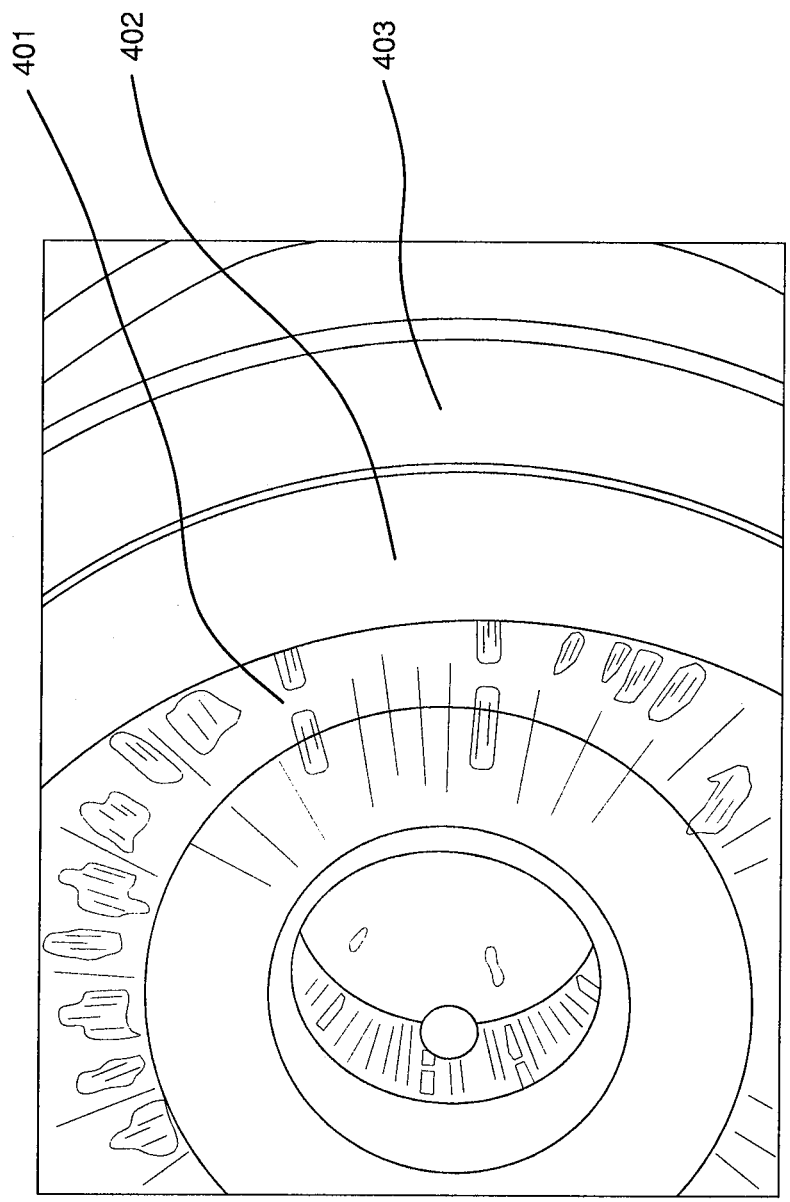
FIG. 4 is a diagram representing a view of a wafer in a processing chamber in accordance with an embodiment of the present invention.

A borescope was used in a test with a field of view between 10°-60°. The borescope was positioned in such a way that it can monitor wafer and susceptor position during hand-off and during process in such a way that pre-heat ring and liner are in the field-of-view. Images were provided on a monitor and were stored on a DVR. The camera was a ⅓" CCD camera with a capture card to provide images Real-time videos of the process showed the sequence of wafer transfer-in, susceptor placement, rotation and transfer-out of the chamber. An example of an image capture is shown in FIG. 4. One can distinguish the wafer 401, the susceptor 402, the pre-heat ring 403. Images were used to confirm accurate susceptor leveling, centering and wobble.

The installed imaging and monitoring system was used to minimize thermal deformation effects by optimizing the wafer transfer temperature, transfer time between the robot and susceptor and lamp power distribution. This video feedback based optimization allowed accurate wafer placement and within-specifications process.

In certain embodiments, the imaging and monitoring system can be used for direct viewing of images. Images can also be recorded. One may also provide image data to a machine vision system. The camera may be a camera that is used in a machine vision application. This allows the system to perform automated image processing and pattern recognition tasks for feature detection and automatic interdiction of positional out-of-spec events. The system can be programmed to perform image tasks that will recognize events such as: wafer slide, out-of-pocket; susceptor centering and wobble, preheat ring alignment; wafer droop, warpage; and robot blade misalignment. According to one or more embodiments, recognition of one or more of such events may result in the generation of an alarm or an automatic action, for example, corrective action.

According to one or more embodiments, software solutions may be provided for specific recognition or process control tasks. For example, out-of-pocket of a wafer may be detected by software and may cause an alarm to an operator. Small changes may also be detected that will not be catastrophic but indicate a requirement for relatively small adjustments before the processing drifts out of specification. Detection of variation can be performed by a vision system. Further processing, such as correlation of variations to process parameters and calculations of adjustments can be performed by additional software. Such a control program may also be enabled to automatically adjust process parameters. As part of an automatic task package, a special calibration wafer may be provided. In some embodiments, the monitoring and imaging system may also be integrated in an overall semiconductor fabrication monitoring or control system.

Using a Laser Spot for Detection of Positional Inaccuracies

Figure 5:
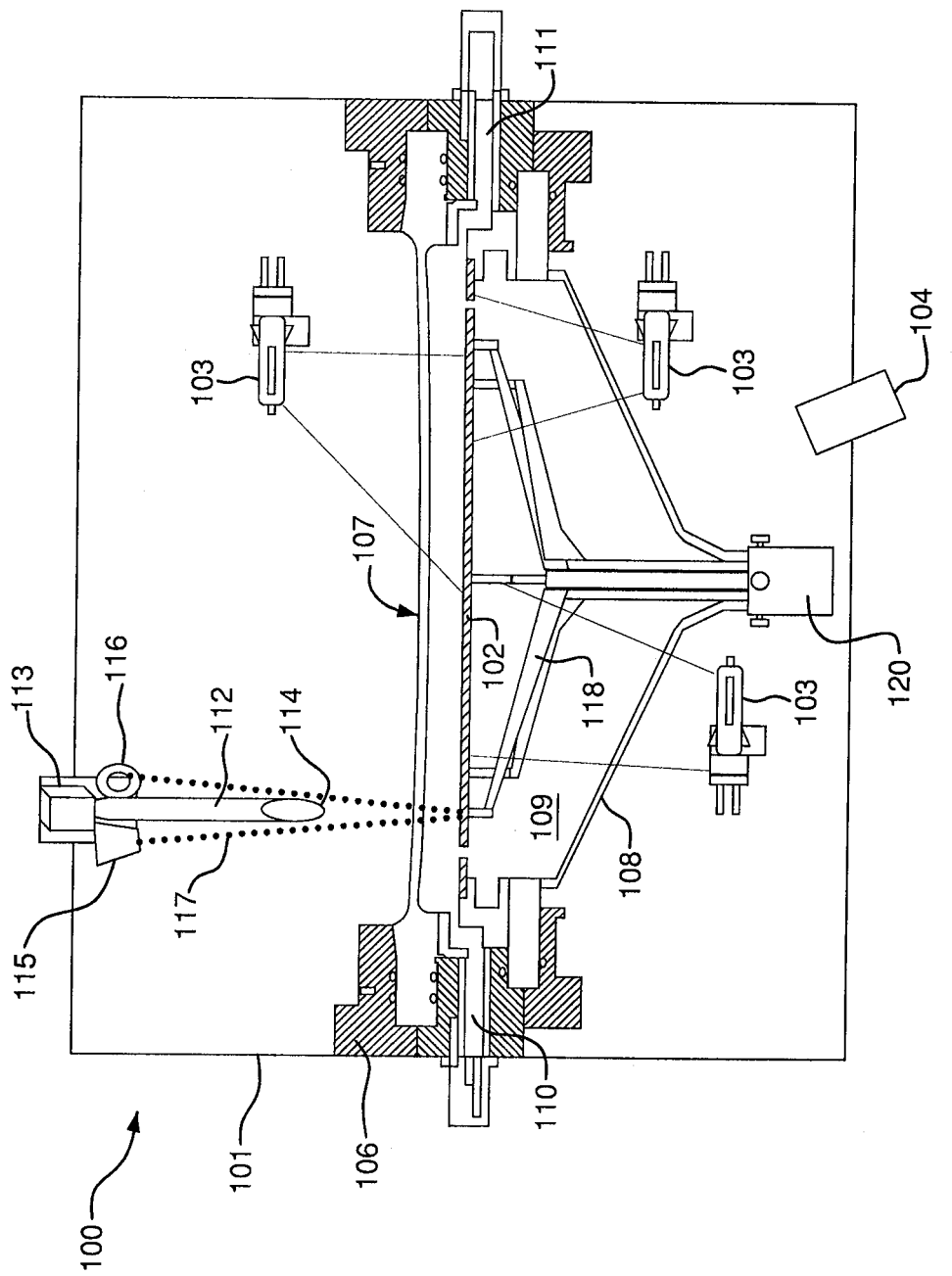
FIG. 5 is a diagram of a high temperature semiconductor process chamber in accordance with a further embodiment of the present invention.

In another embodiment of the invention, a laser light is used for obtaining information about potential misalignment of a substrate on a susceptor or deformation of a substrate outside preferred dimensions. In one embodiment of such as system, a solid state laser such as a green light emitting laser for maximum contrast can be attached parallel to the borescope. An exemplary system 100 is shown in FIG. 5, which similar to the system shown in FIG. 2, but with laser and detector added. FIG. 5 shows in diagram a laser 115 attached parallel to the borescope 112. The laser 115 can be positioned so that it illuminates a wafer positioned on the susceptor 102 in a perpendicular fashion. The laser can also provide illumination under a slight angle as is shown in FIG. 5 in diagram by a ray 117. The laser light can come from one of several sources. In one embodiment, the laser light may also be provided to the wafer by a light conducting optical fiber. In this embodiment, the fiber may be fixed under a preferred angle to illuminate the wafer. However, the laser may be located in a position with a lower temperature than the operational temperature at the inside of the chamber. The light attenuation of the fiber is negligible for the purpose of conducting sufficient light to provide sufficient detectable illumination to the wafer.

A detector 116 may be positioned alongside the borescope for detecting the laser light. Such a detector may be a camera or a detector array. A detector array may comprise detecting elements in different positions. Which element is illuminated by the laser beam 117 reflected by a substrate such as a wafer may depend on the positioning and geometry or deformation of the wafer. One can determine an initial reflective state and beam detection that corresponds with a preferred or correct position or geometry of the wafer. One can also determine a second range of sensor elements that, when illuminated, indicate non-optimal conditions of the wafer, which may provide an alert but do not require interruption of the chamber processes. A third range of illuminated sensor elements may indicate conditions that require interruption of the chamber processes.

The illumination and detection can be tested by using one or more calibration wafers. The illumination or the detector or both may be externally adjustable, to provide means for calibration for different substrates or different processing conditions.

An embodiment of one laser source with one detector is sufficient to measure deviations in position and/or geometry in two coordinates. In order to measure directly three dimensional coordinates, two illumination sources and two detectors can be used. Such a configuration is also fully contemplated and within the scope of the present invention.

A camera may also be used as a detector for a laser illuminated spot and to calculate deviations in coordinates. Software available for machine vision purposes as mentioned before may be used to determine numerical values of coordinates of a laser spot and determine deviations and assist with possible actions to be taken by for instance using certain preset alarm conditions. The camera may be the camera described above with respect to FIG. 2. The borescope may have a sufficient field of vision to capture anticipated maximum deviations of a laser spot from its initial position.

Reference throughout this specification to "one embodiment," "certain embodiments," "one or more embodiments" or "an embodiment" means that a particular feature, structure, material, or characteristic described in connection with the embodiment is included in at least one embodiment of the invention. Thus, the appearances of the phrases such as "in one or more embodiments," "in certain embodiments," "in one embodiment" or "in an embodiment" in various places throughout this specification are not necessarily referring to the same embodiment of the invention. Furthermore, the particular features, structures, materials, or characteristics may be combined in any suitable manner in one or more embodiments.

Although the invention herein has been described with reference to particular embodiments, it is to be understood that these embodiments are merely illustrative of the principles and applications of the present invention. It will be apparent to those skilled in the art that various modifications and variations can be made to the method and apparatus of the present invention without departing from the spirit and scope of the invention. Thus, it is intended that the present invention include modifications and variations that are within the scope of the appended claims and their equivalents.

The invention claimed is:

1. An optical monitoring system for a semiconductor substrate process chamber comprising:
   a borescope having a sensor end and a viewing end, the viewing end being positioned inside the process chamber;
   an optical sensor positioned at the sensor end of the borescope to provide image data; and
   an infrared (IR) filter positioned at the viewing end of the borescope and a reflective sheath covering the borescope, wherein the reflective sheath has a surface selected from a gold coated surface and a silver coated surface, wherein the system provides image data for viewing or data processing to monitor positions of the substrate in the process chamber.

2. The optical monitoring system as claimed in claim 1, wherein the optical monitoring system is positioned to monitor a susceptor supporting a substrate in the process chamber.

3. The optical monitoring system as claimed in claim 2, wherein the optical monitoring system is positioned to measure a substrate position in situ during wafer processing.

4. The optical monitoring system as claimed in claim 2, wherein the borescope is positioned to obtain an image of an edge of the substrate and an edge of the susceptor.

5. The optical monitoring system as claimed in claim 1, wherein an operational temperature inside the chamber is in a range of about 25° C. to 1200° C.

6. The optical monitoring system as claimed in claim 1, wherein the inside of the reflective sheath is kept cool below 100° C. when the chamber temperature is in the range of about 500° C. to about 1200° C.

7. The optical monitoring system as claimed in claim 1, wherein the sensor is a CCD or CMOS camera.

8. The optical monitoring system as claimed in claim 1, further comprising a vision system to process signals provided by a camera.

9. The optical monitoring system as claimed in claim 8, wherein the system determines a deviation of a position of a substrate compared to a preferred position of the substrate.

10. The optical monitoring system as claimed in claim 8, wherein the system detects at least one occurrence selected from wafer slide, out-of-pocket, susceptor centering, susceptor wobble, preheat ring alignment, wafer droop, warpage, robot blade misalignment and warping of a substrate.

11. The optical monitoring system as claimed in claim 8, wherein the system is in communication with and outputs data to a process monitoring system.

12. The optical monitoring system as claimed in claim 8, wherein the system is in communication with and outputs data to a semiconductor fabrication laboratory monitoring system.

13. The optical monitoring system as claimed in claim 1, wherein the borescope has a field of view in the range of 10 to 60 degrees, an aperture in the range of 2 mm to 10 mm, and the borescope provides a complete image fill of the sensor.

14. The optical monitoring system as claimed in claim 1, further comprising an image recording device to record a signal provided by the sensor.

15. The optical monitoring system as claimed in claim 1, further comprising a laser to illuminate the substrate with a laser spot and a detector array to detect the laser spot.

16. The optical monitoring system as claimed in claim 15, further comprising a pair of lasers to illuminate the substrate with a laser spot and a pair of detectors.

17. The optical monitoring system as claimed in claim 15, further comprising a processor and software executable by the processor to determine plane coordinates of the laser spot and to detect variations in geometric properties of the substrate from variations in plane coordinates of the laser spot.

18. The optical monitoring system of claim 1, wherein the infrared filter has band-pass properties such that the transmission through the visible wavelengths is between 20% to 50% but the transmission at near and far infrared wavelengths is less than 10%.

19. A kit incorporating the optical monitoring system as claimed in claim 1, and further comprising fixtures and cabling.

20. A semiconductor processing chamber incorporating the optical monitoring system of claim 1.

* * * * *